US010371777B2

(12) United States Patent
Schar et al.

(10) Patent No.: US 10,371,777 B2

(45) Date of Patent: Aug. 6, 2019

(54) MRI PROPELLER WITH MOTION CORRECTION, WATER-FAT SEPARATION AND ESTIMATION OF MAGNETIC FIELD INHOMOGENEITY INFORMATION

(71) Applicants: KONINKLIJKE PHILIPS N.V., Eindhoven (NL); DIGNITY HEALTH, Chandler, AZ (US)

(72) Inventors: Michael Schar, Eindhoven (NL); Holger Eggers, Eindhoven (NL); James Grant Pipe, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 159 days.

(21) Appl. No.: 15/123,077

(22) PCT Filed: Feb. 13, 2015

(86) PCT No.: PCT/IB2015/051072

§ 371 (c)(1), (2) Date: Sep. 1, 2016

(87) PCT Pub. No.: WO2015/132685

PCT Pub. Date: Sep. 11, 2015

(65) Prior Publication Data

US 2017/0067977 A1 Mar. 9, 2017

Related U.S. Application Data

(60) Provisional application No. 62/078,031, filed on Nov. 11, 2014, provisional application No. 61/948,202, filed on Mar. 5, 2014.

(51) Int. Cl.

| | |
|---|---|
| ***G01R 33/48*** | (2006.01) |
| ***G01R 33/565*** | (2006.01) |
| ***G01R 33/561*** | (2006.01) |

(52) U.S. Cl.

CPC ..... *G01R 33/4828* (2013.01); *G01R 33/4824* (2013.01); *G01R 33/5611* (2013.01); *G01R 33/56509* (2013.01)

(58) Field of Classification Search

CPC ............ G01R 33/4824; G01R 33/4828; G01R 33/385; G01R 33/4818; G01R 33/482;

(Continued)

(56) References Cited

U.S. PATENT DOCUMENTS

2009/0169083 A1* 7/2009 Li .................... G01R 33/4824 382/131

2010/0117645 A1 5/2010 Eggers (Continued)

FOREIGN PATENT DOCUMENTS

| | | | |
|---|---|---|---|
| WO | 2008135885 | A1 | 11/2008 |
| WO | 2013118040 | A1 | 8/2013 |
| WO | 2014037870 | A1 | 3/2014 |

OTHER PUBLICATIONS

Pipe JG. Motion correction with PROPELLER MRI: application to head motion and free-breathing cardiac imaging. Magn Reson Med 1999; 42:963-969.

(Continued)

*Primary Examiner* — Rishi R Patel

(57) ABSTRACT

A magnetic resonance (MR) imaging (MRI) system, the MRI system may include at least one controller which may be configured to: acquire MR information for at least first and second blades of a periodically rotated overlapping parallel lines with enhanced reconstruction (PROPELLER) imaging method; generate, for at least the first and second blades, main field inhomogeneity information based upon the acquired MR information, the main field inhomogeneity information indicating main field inhomogeneity; generate water and fat information individually for at least the first and second blades based upon the acquired MR information (Continued)

and the generated main field inhomogeneity information for the corresponding blade of the first and second blades; and correct at least one of the water and fat information for spatial distortions caused by the main field inhomogeneity or a predetermined chemical shift difference between water and fat.

14 Claims, 4 Drawing Sheets

(58) Field of Classification Search
CPC .............. G01R 33/546; G01R 33/5611; G01R 33/5615; G01R 33/5618; G01R 33/56509; G01R 33/56527
See application file for complete search history.

(56) References Cited

U.S. PATENT DOCUMENTS

| | | | | |
|---|---|---|---|---|
| 2011/0274331 | A1 | 11/2011 | Weng | |
| 2014/0003694 | A1* | 1/2014 | Weng | G01R 33/4828 382/131 |
| 2014/0210471 | A1* | 7/2014 | Stemmer | G01R 33/56554 324/309 |
| 2015/0212183 | A1* | 7/2015 | Beck | G01R 33/4818 324/309 |

OTHER PUBLICATIONS

Dixon WT. Simple proton spectroscopic imaging. Radiology 1984; 153: 189-194.

Huo D, Li Z, Aboussouan E, Karis JP, Pipe JG. Turboprop IDEAL: a motion-resistant fatwater separation technique. Magn Reson Med 2009; 61 :188-195.

Weng D, Pan Y, Zhong X, Zhuo Y. Water-fat separation with parallel imaging based on BLADE. Magn Reson Imaging 2013; 31 :656-663.

He Et Al "Regularized Iterative Reconstruction for Undersampled BLADE and its Applications . . ." Magnetic Resonance in Med. vol. 65, p. 1314-1325 (2011).

Huanzhou Yu et al: "Field map estimation with a region growing scheme for iterative 3-point water-fat decomposition".Magnetic Resonance in Medicine,vol. 54, No. 4,Sep. 2, 2005 (Sep. 2, 2005), pp. 1032-1039.

Reeder S B etal:"Multicoil Dixon Chemical Species Separation With an Iterative Least-Squares Estimation Method",Magnetic Resonance in Medicine, John Wiley & Sons, Inc, US,vol. 51, No. 1, Dec. 29, 2003 (Dec. 29, 2003), pp. 35-45.

Yun Jiang et al: "Self-navigated ideal water-fat separation with variable k-space averaging", Biomedical Imaging: From NANO to MACRO,2009.ISBI '09. IEEE International Symposium on, IEEE, Piscataway, NJ, USA,Jun. 28, 2009 (Jun. 28, 2009), pp. 121-124.

* cited by examiner

MRI PROPELLER WITH MOTION CORRECTION, WATER-FAT SEPARATION AND ESTIMATION OF MAGNETIC FIELD INHOMOGENEITY INFORMATION

CROSS REFERENCE TO RELATED APPLICATIONS

This application is a U.S. national phase application of International Application No PCT/IB2015/051072, filed of Feb. 13, 2015, which claims the benefit of U.S. provisional Application Ser. Nos. 61/948,202 filed Mar. 5, 2014 and 62/078,031 filed Nov. 11, 2014 and are incorporated herein by reference.

The present system relates to a magnetic resonance imaging (MRI) system for reconstructing magnetic resonance (MR) images with enhanced image quality and, more particularly, to an MRI system for performing a periodically rotated overlapping parallel lines with enhanced reconstruction (PROPELLER)-Dixon imaging method for motion insensitive imaging, motion insensitive fat-suppressed imaging, and motion insensitive water-fat imaging.

PROPELLER imaging has been established as a motion insensitive acquisition and reconstruction method, primarily in combination with turbo-spin-echo (TSE) imaging (see, R1). Unfortunately, PROPELLER imaging suffers from several shortcomings. For example, one source of artefacts in PROPELLER imaging is fat. Due to the difference in chemical shift between water and fat, the fat is shifted in a half or full circle, typically leading to a blurring of fat in reconstructed images. Additionally, the motion correction may reduce the fat blurring at the expense of water sharpness. Both may limit the maximum water-fat shift or minimum readout bandwidth of the acquisition and thus the signal-to-noise ratio. Further, another source of artefacts in PROPELLER imaging is main field inhomogeneity, which may cause a local blurring in areas of off-resonance.

Dixon imaging (see, R2), when combined with PROPELLER imaging (see, R3 and R4), does not straightforwardly cure these shortcomings of PROPELLER imaging. Even worse, it may introduce further shortcomings. For instance, relying on pairs of blades with opposite readout direction for phase correction essentially doubles scan time, which is undesirable. Moreover, motion between (e.g., among) the pairs of blades, as well as the chemical shift, may affect the phase correction. Distributing the chemical shift encoding for each blade over two echo trains also doubles scan time. Moreover, it compromises data consistency and may affect water-fat separation.

The system(s), device(s), method(s), user interface(s), computer program(s), processes, etc. (hereinafter each of which will be referred to as system, unless the context indicates otherwise) described herein address problems, such as image artefacts, and/or provide one or more alternatives to prior art systems.

In accordance with embodiments of the present system, there is provided a magnetic resonance (MR) imaging (MRI) system, the system may include at least one controller which may be configured to: acquire MR information for at least first and second blades of a periodically rotated overlapping parallel lines with enhanced reconstruction (PROPELLER) imaging method; generate, for at least the first and second blades, main field inhomogeneity information based upon the acquired MR information, the main field inhomogeneity information indicating main field inhomogeneity; generate water and fat information individually for at least the first and second blades based upon the acquired MR information and the generated main field inhomogeneity information for the corresponding blade of the first and second blades; correct at least one of the water and fat information for spatial distortions caused by the main field inhomogeneity or a predetermined chemical shift difference between water and fat; and/or estimate and correct motion between blades of at least the first and second blades based on at least one of the corrected water and fat information so as to form separate or combined, motion-corrected water and fat information individually for at least the first and second blades.

In accordance with embodiments of the present system, the at least one controller may be further configured to reconstruct at least one image based upon the separate or combined, motion-corrected water and fat information for at least the first and second blades. It is also envisioned that the at least one controller may be further configured to acquire the MR information for at least the first and second blades within a single echo train. The at least one controller may further be configured to perform a modified turbo-spin echo (TSE) sequence, in which the MR information for at least the first and second blades is acquired within a single echo-train at different echo shifts in an interleaved manner. It is also envisioned that the at least one controller may also be configured to perform a modified turbo-spin echo (TSE) sequence, in which the MR information for at least the first and second blades is acquired within a single echo-train at a single echo shift. It is also envisioned that the at least one controller may be further configured to generate the water and fat information for at least the first and second blades using only the MR information acquired for the respective blade. Further, in accordance with some embodiments of the present system, the at least one controller may also be configured to exchange the generated main field inhomogeneity information between at least the first and second blades or at least two of a plurality of slices for the generation of the water and fat information for at least the first and second blades. Moreover, the at least one controller may be further configured to skip the estimation and correction of motion between blades when it is determined that an expected or actual motion is substantially not well described by the motion model employed in the estimation and correction of the motion.

In accordance with yet other embodiments of the present system, there is provided a magnetic resonance (MR) imaging (MRI) system including at least one controller (110, 410) configured to: acquire MR information for at least first and second blades of a periodically rotated overlapping parallel lines with enhanced reconstruction (PROPELLER) imaging method; generate, for at least the first and second blades, main field inhomogeneity information based upon the acquired MR information, the main field inhomogeneity information indicating main field inhomogeneity; generate water and fat information individually for at least the first and second blades based upon the acquired MR information and the generated main field inhomogeneity information for the corresponding blade of the first and second blades; correct at least one of the water and fat information for spatial distortions caused by the main field inhomogeneity or a predetermined chemical shift difference between water and fat; and reconstruct at least one image based upon the separate or combined, motion-corrected water and fat information for at least the first and second blades.

In accordance with yet other embodiments of the present system, there is provided a method of reconstructing images obtained by an MR imaging (MRI) system the method performed by at least one controller of the MR imaging system and may include acts of: acquiring MR information for at least first and second blades of a periodically rotated overlapping parallel lines with enhanced reconstruction (PROPELLER) imaging method; generating main field inhomogeneity information based upon the acquired MR information, the main field inhomogeneity information indicating main field inhomogeneity; generating water and fat information individually for at least the first and second blades based upon the acquired MR information and the generated main field inhomogeneity information for the corresponding blade of the first and second blades; correcting at least one of the water and fat information for spatial distortions caused by the main field inhomogeneity or the known chemical shift difference between water and fat; and/or estimating and correcting motion between blades of at least the first and second blades based on at least one of the corrected water and fat information so as to form separate or combined, motion-corrected water and fat information individually for at least the first and second blades.

The method may further include an act of reconstructing at least one image based upon the separate or combined, motion-corrected water and fat information for at least the first and second blades. Further, the method may include an act of acquiring the MR information for at least the first and second blades within a single echo train. It is also envisioned that the method may include an act of performing a modified turbo-spin echo (TSE) sequence, in which the MR information for at least the first and second blades is acquired within a single echo-train at different echo shifts in an interleaved manner. It is further envisioned that the method may include an act of performing a modified turbo-spin echo (TSE) sequence, in which the MR information for at least the first and second blades is acquired within a single echo-train at a single echo shift. It is also envisioned that the method may include an act of generating the water and fat information for at least the first and second blades using only the MR information acquired for the respective blade. Moreover, the method may include an act of exchanging the generated main field inhomogeneity information between at least the first and second blades or at least two of a plurality of slices for the generation of the water and fat information for at least the first and second blades.

In accordance with embodiments of the present system, there is provided a computer program stored on a computer readable non-transitory memory medium, the computer program configured to reconstruct images obtained from a magnetic resonance (MR) image system, the computer program may include a program portion which may be configured to: acquire MR information for at least first and second blades of a periodically rotated overlapping parallel lines with enhanced reconstruction (PROPELLER) imaging method; generate main field inhomogeneity information based upon the acquired MR information, the main field inhomogeneity information indicating main field inhomogeneity; generate water and fat information individually for at least the first and second blades based upon the acquired MR information and the generated main field inhomogeneity information for the corresponding blade of the first and second blades; correct at least one of the water and fat information for spatial distortions caused by the main field inhomogeneity or a predetermined chemical shift difference between water and fat; and/or estimate and correct motion between blades of at least the first and second blades based on at least one of the corrected water and fat information so as to form separate or combined, motion-corrected water and fat information individually for at least the first and second blades.

It is also envisioned that the program portion may be further configured to reconstruct at least one image based upon the separate or combined, motion-corrected water and fat information for at least the first and second blades. It is further envisioned that the program portion may be further configured to acquire the MR information for at least the first and second blades within a single echo train.

The invention is explained in further detail, and by way of example, with reference to the accompanying drawings wherein.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well-known devices, circuits, tools, techniques and methods are omitted so as not to obscure the description of the present system. It should be expressly understood that the drawings are included for illustrative purposes and do not represent the entire scope of the present system. In the accompanying drawings, like reference numbers in different drawings may designate similar elements. The term and/or and formatives thereof should be understood to mean that only one or more of the recited elements, actions, etc., may need to be suitably present, performed, etc. (e.g., only one recited element is present, two of the recited elements may be present, etc., up to all of the recited elements may be present) in a system in accordance with the claims recitation and in accordance with one or more embodiments of the present system. Similarly while terms such as "the plurality", "each of the plurality", "all of the plurality", "all . . . " etc., and formatives thereof are illustratively used herein, these terms and formatives should be understood to mean that only two or more of the recited elements may need to be suitably present, performed, etc. (e.g., in a case wherein there are four blades, the plurality of blades may refer to only two of the four blades, three of the four blades, etc., up to all of the four blades) in a system in accordance with the claims recitation and in accordance with one or more embodiments of the present system.

Figure 1:
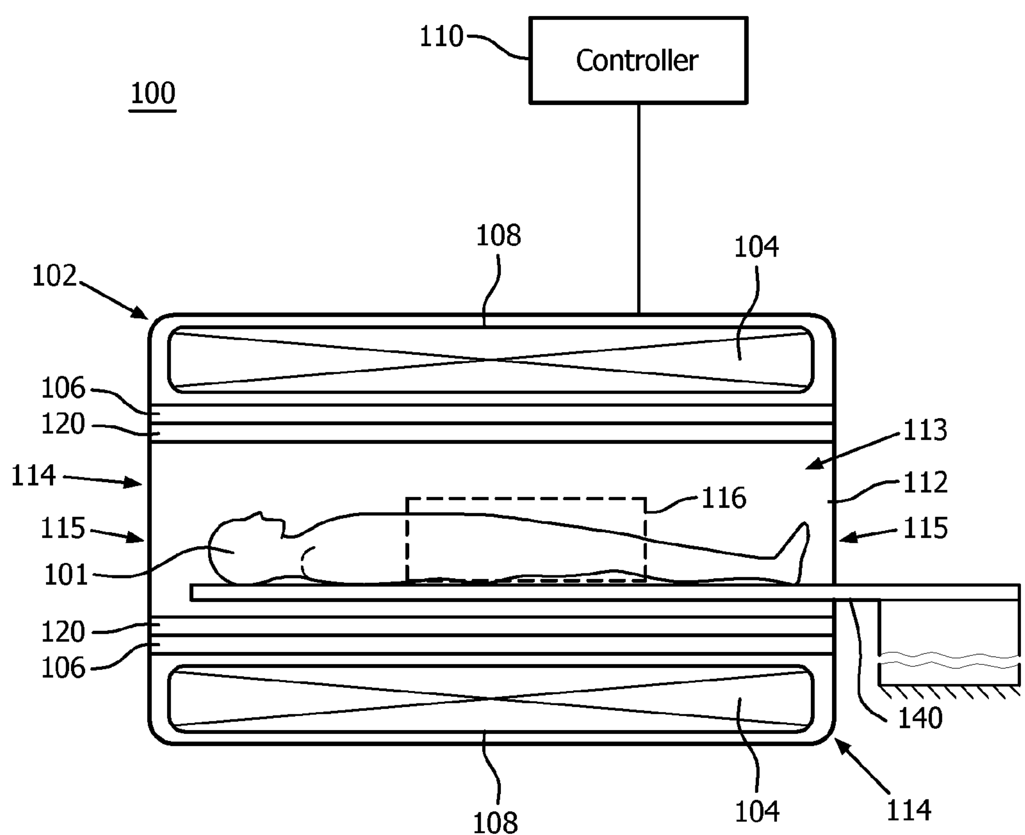
FIG. 1 shows a cutaway side view of a portion of a magnetic resonance (MR) system operating in accordance with embodiments of the present system.

FIG. 1 shows a cutaway side view of a portion of a magnetic resonance (MR) system 100 (hereinafter system 100 for the sake of clarity) operating in accordance with embodiments of the present system. The system 100 may include one or more of a controller 110, a memory, a display, a body 102, a main magnet 104, gradient coils 106, and a radio frequency (RF) portion 120. A patient support 140 may be provided to support an object-of-interest (OOI) such as a patient 101 and/or or a phantom (hereinafter patient for the sake of clarity) and/or to position the patient 101 in a desired position and/or orientation in relation to the body 102 under the control of the controller 110.

The body 102 may include at least one cavity 108 and a main bore 112 situated between opposed ends 114. The main bore 112 may be situated between opposed openings 115 of the body 102 and may be configured to receive the patient 101 through one of the opposed openings 115. The at least one cavity 108 may be configured to receive one or more of the main magnet 104, the gradient coils 106, and at least a portion of the RF portion 120. The body 102 may further include a cooling mechanism (e.g., a cryogenic cooling system, etc.) configured to cool portions of the system 100 such as the main magnet 104, if desired.

The controller 110 may control the overall operation of the system 100 and may include one or more logic devices such as processors (e.g., micro-processors, etc.) etc. The controller 110 may include one or more of a main magnet controller, a gradient controller, an RF controller, and a reconstructor. The main magnet controller may control the operation of the main magnet 104. The gradient controller may control the operation of the gradient coils 106. The RF controller may control the operation of the RF portion 120. The reconstructor may be operative to reconstruct analog information (e.g., from two or more blades) and/or form corresponding image information which may be further processed, stored in a memory of the system for later use, and/or rendered on a display of the system for the convenience of a user.

The controller 110 may further determine or otherwise obtain scan sequences, scan parameters, etc. from a user and/or from the memory and apply them during a scanning procedure. For example, the controller 110 may obtain a scan sequence from the memory and, for example, control one or more of the main magnet 104, the gradient coils 106 and/or RF portion 120 in accordance with the scanning sequence to obtain, for example, desired magnetic resonance information such as echo information. The controller 110 and/or portions thereof may communicate with one or more of the memory, the display, the main magnet 104, the gradient coils 106, the RF portion 120 via any suitable method such as via wired and/or wireless communication methods, via one or more networks (e.g., a wide area network (WAN), a local area network (LAN), the Internet, a proprietary communication bus, a controller area network (CAN), a telephony network, etc.).

The main magnet 104 may have a bore 113 and may be configured to generate a main magnetic field (e.g., a $B_0$ field) within the main bore 112. The main magnetic field may be substantially homogenous within a scanning volume of the main bore 112. The main magnet 104 may include one or more main magnets each configured to generate at least a portion of a main magnetic field. The main magnet 104 may be an annular (e.g., ring) magnet, a planar magnet, a split magnet, an open magnet, a semicircular (e.g., a C-shaped) magnet, etc. The main magnet 104 or portions thereof may be formed from any suitable material such as a superconducting material and/or may operate under the control of the controller 110.

The gradient coils 106 may include one or more gradient coils (e.g., x-, y-, and z-gradient coils) which may produce one or more gradient fields along one or more corresponding axes under the control of the controller 110. The RF portion 120 may include one or more RF transmission coils configured to transmit RF excitation pulses and/or receive (e.g., induced) MR signals (e.g., echo information) under the control of the controller 110. For example, in some embodiments, the RF portion 120 may include a transducer array of transmission and/or reception coils. The RF portion 120 may be situated within the main bore 112 of the body 102 and may be placed in a desired position and/or orientation such as under the patient support 140 to obtain images of a desired scanning volume within the main bore 112. The RF portion 120 may include wired- and/or wireless-type RF coils.

Figure 2:
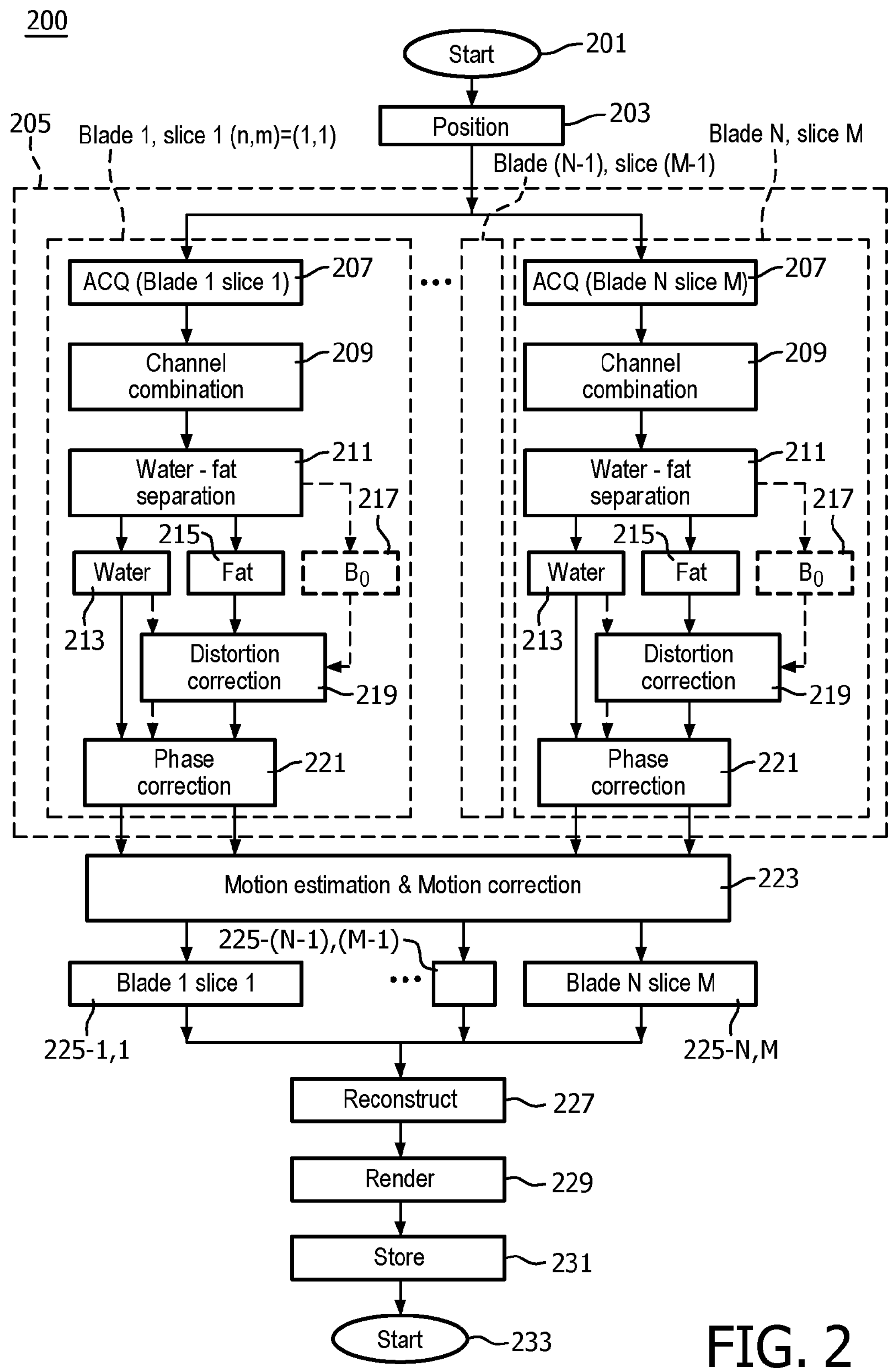
FIG. 2 is a flow diagram that illustrates a process performed by a magnetic resonance system in accordance with embodiments of the present system.

FIG. 2 is a flow diagram that illustrates a process 200 performed by a magnetic resonance system in accordance with embodiments of the present system. The process 200 may be performed using one or more computers communicating over a network and may obtain information from, and/or store information to one or more memories which may be local and/or remote from each other. The process 200 can include one of more of the following acts. Further, one or more of these acts may be combined and/or separated into sub-acts, if desired. Further, one or more of these acts may be skipped depending upon settings in which case, the process may perform the following or further following acts if any. The image information may include, for example, image information acquired as concentric rectangular strips, or blades (e.g., one or more blades), rotated around the center of a k-space. In operation, the process may start during act 201 and then proceed to act 203.

During act 203, the process may position a patient within a bore of the MR system. Accordingly, the process may control actuators of a support table (e.g., a patient support table 140) to position the patient in a desired position and/or orientation within the bore of the MR system. After completing act 203, the process may continue to act 205.

During act 205, the process may perform an acquisition process (act 207) to acquire MR signals (e.g., MR information) and thereafter pre-process the acquired MR information in accordance with embodiments of the present system. The acquisition process may be performed in using a modified PROPELLER (mPROP) imaging method in accordance with embodiments of the present system. During the mPROP acquisition process, data for one or more blades and slices may be acquired. Thereafter, during pre-processing (acts 209-221) the MR information for one or more of the blades may be pre-processed before at least one of motion estimation, motion correction and image reconstruction in accordance with embodiments of the present system. The pre-processing may be repeated for one or more of the blades, slices, etc., for example starting at the first blade and the first slice in a series. For example, assuming there are N blades and M slices in the mPROP imaging method, the process may start at a blade and slice (e.g., Blade 1, Slice 1) and may continue through to one or more of the $N^{th}$ blade and the $M^{th}$ slice (e.g., Blade N, Slice M) as shown. As each of the acts 207 through 221 may be similar to each other and may be repeated for one or more of the $n^{th}$ blade and $m^{th}$ slice, the acts performed for only one blade and slice (e.g., Blade 1, Slice 1) will be discussed for the sake of clarity.

Figure 3:
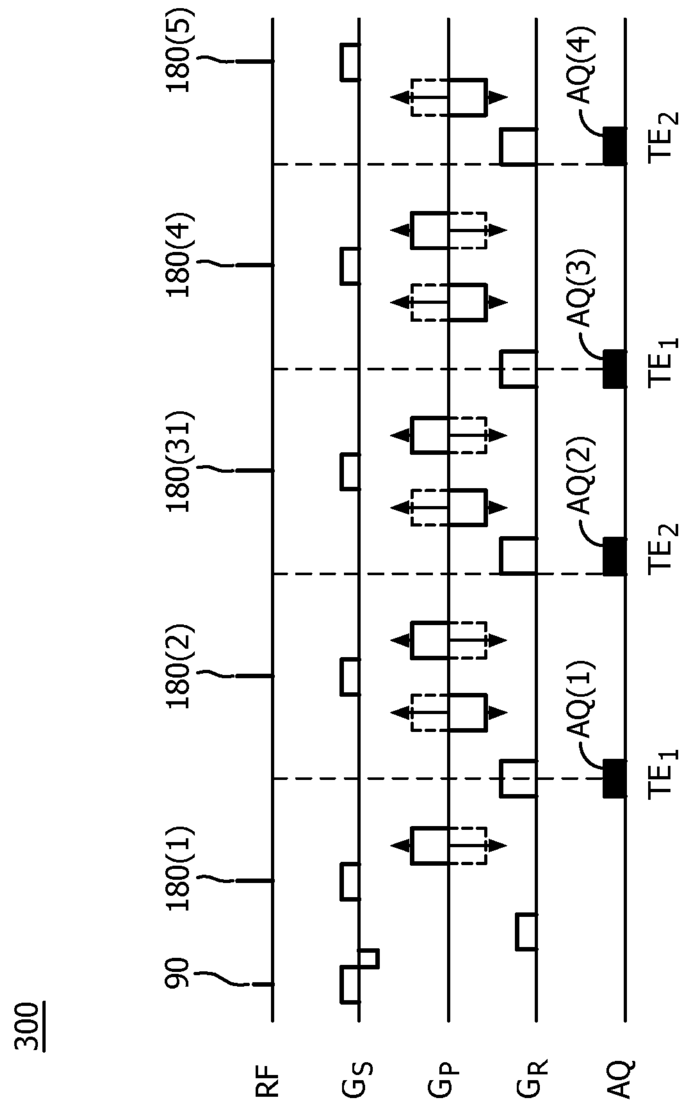
FIG. 3 shows a graph illustrating a modified turbo-spin-echo (mTSE) sequence in accordance with embodiments of the present system.

During act 207, the process may acquire MR information using a suitable MR imaging method such as a modified turbo-spin-echo (mTSE) imaging method employing an mTSE pulse sequence (as will be described below with respect to FIG. 3) in accordance with embodiments of the present system. The mTSE pulse sequence may be generated by a controller of the system and may be selectively applied to gradient coils and/or an RF portion of the system. The mTSE pulse sequence or information related thereto may be stored in a memory of the system and obtained by the controller. For example, FIG. 3 shows a graph 300 illustrating an mTSE sequence in accordance with embodiments of the present system.

In graph 300, radio-frequency (RF) pulses include a single 90 degree radio frequency (RF) pulse which is followed by a series of rapidly applied 180 degree pulses (e.g., see, 180(1) through 180(5), generally 180(*x*)) which are re-phasing (e.g., refocusing) pulses (hereinafter re-phasing pulses for the sake of clarity). For illustrative purposes, only the first five re-phasing pulses of a higher number in a typical pulse train are shown here. Illustratively, all of these RF pulses are accompanied by a corresponding slice selection gradient ($G_s$). An acquisition readout AQ includes acquisition windows (e.g., AQ(1) through (AQ(4)) which follow a corresponding re-phasing pulse of the re-phasing pulses (180(*x*)). Again, for illustrative purposes, only four acquisition windows of a higher number in a typical echo train are shown here. These acquisition windows are accompanied by a corresponding readout gradient ($G_R$). Additionally, an initial dephasing readout gradient is applied between the 90 degree and the first 180 degree RF pulses. For chemical shift encoding, a k-space line may be sampled, for example, twice (e.g., once at echo times or shifts $TE_1$ and $TE_2$). Here, these echo shifts are achieved by shifting the readout gradient and the acquisition window. To highlight them, the dashed vertical lines indicate the positions of the spin echoes. The repeated sampling may be performed after two subsequent refocusing pulses. The phase encoding gradient ($G_P$) then changes after the second refocusing pulse to encode another k-space line. In this manner, the data for a single blade for a single slice is collected in a single echo train with a unipolar readout (i.e. with the same readout gradient polarity, which substantially simplifies the phase correction) and forms corresponding MR information for one or more of the $n^{th}$ blade and $m^{th}$ slice which will be further processed in accordance with embodiments of the present system. Thus, the data to perform a water-fat separation on a single blade in a PROPELLER imaging method, which are the k-space lines forming the single blade, sampled at the echo times or shifts, may be acquired with a single echo train applied in accordance with embodiments of the present system. Accordingly, data consistency and water-fat separation and phase correction may be enhanced. In yet other embodiments, the pulse train may be formed such that the data acquisition is extended to more than two different echo times or shifts, such as to Y echo times or shifts (e.g., $TE_1$, $TE_2$ . . . $TE_{Y-1}$, $TE_Y$). In yet other embodiments, it is envisioned that the process may employ a gradient-and-spin-echo (GRASE) sequence (e.g., rather than an mTSE sequence) to cover more than one echo time or shift after a single re-phasing (e.g., refocusing) pulse. After acquiring the MR information and completing act 207, the process may continue to act 209.

During act 209, the process may perform a channel combination of the MR information obtained during act 207 to form channel-combined information (CC information). Accordingly, the MR information from different coil elements (e.g., from one or more channels of, for example, a plurality of channels of the RF portion) may be combined separately for example for two or more blades (e.g., two or more $n^{th}$ blades of the N blades) which includes one or more of: homogeneity correction, a parallel imaging reconstruction, a compressed sensing reconstruction and/or combinations thereof and the process may form corresponding channel-combined information. After completing act 209, the process may continue to act 211.

During act 211, the process may perform water-fat separation upon the CC information (for two or more of the corresponding blades of the N blades) to form water and fat information (213 and 215, respectively) as well as main field ($B_0$) inhomogeneity information (217). The process may perform water-fat separation using any suitable water-fat separation method. In particular, the process may use two-point Dixon methods, which typically also provide the main $B_0$ inhomogeneity information. It is envisioned that the generated main $B_0$ inhomogeneity information is exchanged between the water-fat separations for two or more blades or two or more slices to ensure a consistent water-fat separation over two or more of the blades and slices and thus to counteract the increased risk of water-fat swaps caused by the low resolution in one blade dimension. According to an exemplary embodiment, to obtain a B0 map for each blade, B0 maps are first generated for each slice: PROPELLER with motion correction is performed on each echo to generate two images with isometric voxel size. Dixon water-fat separation is then performed to output a B0 map for each slice. In this step, the blades can be cropped in k-space domain to a quarter of their original size in readout direction, while the number of lines per blade remains untouched. There are several reasons for this: First, both PROPELLER and Dixon algorithms are much faster with the reduced blade size. Secondly, blurring of fat, due to potentially large water-fat shirt (WFS), is hidden in the four times larger voxels. And thirdly, B0 maps are slowly varying in space allowing for a lower spatial resolution. Next, the B0 map for each slice is adapted for each blade individually. This involves rotating the B0 map according to the blade readout direction, and additionally applying the rotation and translation as detected by the PROPELLER algorithm. Each resulting B0 map is cropped and interpolated to the original blade size in k-space domain. After completing act 211, the process may continue to act 219.

During act 219, the process may correct spatial distortion of the fat information (215) to form distortion-corrected fat information in accordance with the water information (213). The distortion correction may also take into account a shift of water and fat due to main field ($B_0$) inhomogeneity as indicated by the main field ($B_0$) inhomogeneity information (217). Accordingly, the distortion correction may compensate for a shift of fat with respect to water due to the known difference in chemical shift between water and fat (e.g., which may form a predetermined known difference in chemical shift between water and fat), and for a shift of both fat and water due to main field in homogeneity, as known from the main field inhomogeneity information provided by the water-separation performed during act 211. After completing act 219, the process may continue to act 221.

During act 221, the process may perform a phase correction on the water information (213) and the fat information to form phase-corrected water and fat information, respectively. The process may do this using any suitable phase correction method. In particular, phase correction methods proposed previously for PROPELLER imaging may be applied in this stage. Alternatively, and in accordance with some embodiments of the present system, a phase correction may be applied in an earlier stage. However, it is preferable to ensure that the phase correction does not interfere with the water-fat separation, which depends on phase information, i.e. the phase correction has to be applied consistently to corresponding MR information collected at different echo times or echo shifts. Alternatively, and in accordance with embodiments of the present system, the phase correction may also be applied after the motion estimation and/or motion correction performed in act 223. After completing act 221, the process may continue to act 223.

During act 223, the process may perform motion estimation and/or motion correction upon the distortion- and phase-corrected water information and the distortion- and phase-corrected fat information to form distortion-, phase-, and motion-corrected (DMP-corrected) information separately for each of the N blades. The DMP-corrected information may be separated into water and fat information for each blade (e.g., see 225-1,1 through 225-N,M). Alternatively (depending upon system and/or user settings), the DMP-corrected information may be recombined, for instance by forming a linear combination of the water and fat information, for instance for obtaining in-phase information. In accordance with embodiments of the present system, it is envisioned that the motion estimation and motion correction may be performed simultaneously for example for two or more blades and slices, or simultaneously for two or more blades of a single slice. It is also envisioned that the motion estimation and correction may be performed on the separated water and fat information, exploiting different characteristics of this information, such as structure, sparsity, and contrast. Furthermore, it is envisioned that the motion estimation and correction may be skipped if the expected or actual motion is, or is likely, not well described by the motion model employed in the estimation and the correction of the motion. For instance, in anatomies where motion typically leads to an elastic deformation, such as the abdomen, a motion estimation and correction based on a rigid body model may be detrimental and may therefore be skipped in which case, the process may perform the following or further following acts (e.g., one or more following acts, such as acts 227 and/or further acts if any). Accordingly, the system may determine whether the expected or actual motion is, or is likely, not well described by the motion model employed in the estimation and the correction of the motion using any suitable method.

In yet other embodiments, the data for each blade and/or slice (or selected blades and/or slices) may be output and/or stored in a memory of the system for later use, if desired. After completing act 223, the process may continue to act 227.

During act 227, the process may reconstruct an image by combining data for two or more blades of one or more slices (e.g., which may include the DMP-corrected information for one or more blades (e.g., see 225-1,1 through 225-N,M)) of the $m^{th}$ slice and form corresponding reconstruction information using any suitable reconstruction method, such as a gridding reconstruction method. As may be readily appreciated, in accordance with embodiments of the present system, the data for one or more blades may be motion corrected for example, in a case wherein act 223 is not skipped for the one or more blades. In any event, image reconstruction may be achieved by combining the data for two or more blades of one or more slices (e.g., all blades of each slice) in a gridding reconstruction and form corresponding reconstruction information. In accordance with embodiments of the present system, recombining the water and fat information for two or more blades at the end of the data preprocessing allows reiterating the water-fat separation on the resulting full resolution composite images, thereby potentially enhancing the accuracy of the water-fat separation and the quality of the resulting full resolution water and fat images. In accordance with embodiments of the present system, the process may reconsider a difference in spatial sensitivity of different coil elements of the RF portion in a gridding reconstruction which may enhance image quality. After completing act 227, the process may continue to act 229.

During act 229, the process may render the reconstruction information on a display of the system so that a user may view images obtained by embodiments of the present system. Further, the process may further provide a user interface (UI) with which a user may interact to change viewing parameters, enter information (e.g., notes, commands, selections, etc.), etc. For example, a user may select to view water images and fat images separately or may select to view water- and fat-combined images. In accordance with embodiments of the present system, one or more of image acquisition, processing and rendering may occur in real time. After completing act 229, the process may continue to act 231.

During act 231, information generated by the process such as the reconstruction information, may be stored in a memory of the system for later use. As may be readily appreciated, at any time during and/or after the process, information may be stored for subsequent rendering and/or processing. After completing act 231, the process may continue to act 233 where the process may end.

Figure 4:
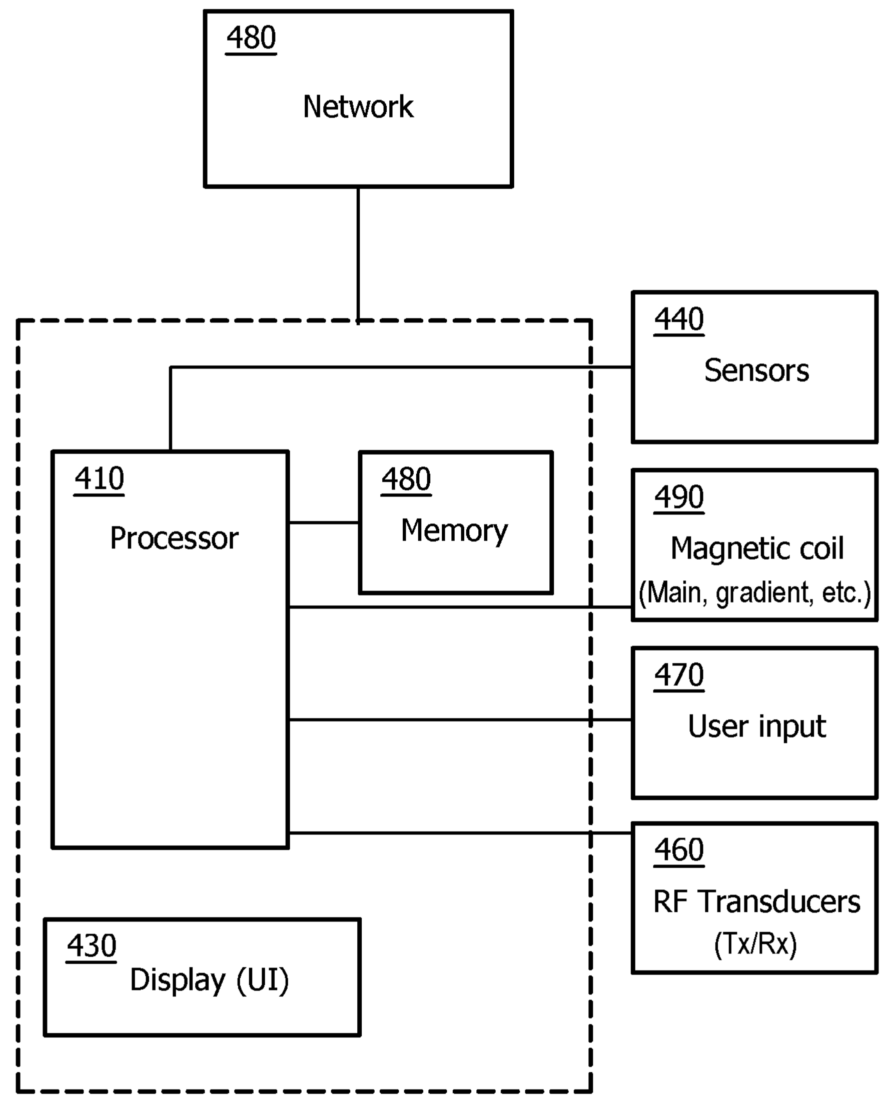
FIG. 4 shows a portion of a system (e.g., peer, server, etc.) in accordance with embodiments of the present system.

FIG. 4 shows a portion of a system 400 in accordance with embodiments of the present system. For example, a portion of the present system may include a processor 410 (e.g., a controller) operationally coupled to a memory 420, a display 430, RF transducers 460, magnetic coils 490, and a user input device 470. The memory 420 may be any type of device for storing application data as well as other data related to the described operation. The application data and other data are received by the processor 410 for configuring (e.g., programming) the processor 410 to perform operation acts in accordance with the present system. The processor 410 so configured becomes a special purpose machine particularly suited for performing in accordance with embodiments of the present system.

The operation acts may include configuring an MRI system by, for example, controlling the magnetic coils 490, and/or the RF transducers 460. The magnetic coils 490 may include main magnetic coils, and gradient coils (e.g., x-, y-, and z-gradient coils) and may be controlled to emit a main magnetic field and/or gradient fields in a desired direction and/or strength. The controller may control one or more power supplies to provide power to the magnetic coils 490 so that a desired magnetic field is emitted at a desired time. The RF transducers 460 may be controlled to transmit RF pulses at the patient and/or to receive echo information therefrom. A reconstructor may process received signals such as the echo information and transform them (e.g., using one or more reconstruction techniques of embodiments of the present system) into content which may include image information (e.g., still or video images (e.g., video information)), data, and/or graphs that can be rendered on, for example, a user interface (UI) of the present system such as on the display 430, etc. Further, the content may then be stored in a memory of the system such as the memory 420 for later use. Thus, operation acts may include requesting, providing, and/or rendering of content such as, for example, reconstructed image information obtained from echo information as described herein. The processor 410 may render the content such as video information on a UI of the system such as a display of the system.

The user input 470 may include a keyboard, a mouse, a trackball, or other device, such as a touch-sensitive display, which may be stand alone or be a part of a system for communicating with the processor 410 via any operable link. The user input device 470 may be operable for interacting with the processor 410 including enabling interaction within a UI as described herein. Clearly the processor 410, the memory 420, display 430, and/or user input device 470 may all or partly be a portion of a computer system or other device such as an MR system.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 420 or other memory coupled to the processor 410.

The program and/or program portions contained in the memory 420 may configure the processor 410 to implement the methods, operational acts, and functions disclosed herein.

The processor 410 is operable for providing control signals and/or performing operations in response to input signals from the user input device 470 as well as in response to other devices for example of a network 480 and executing instructions stored in the memory 420. The processor 410 may include one or more of a microprocessor, an application-specific or general-use integrated circuit(s), a logic device, etc. Further, the processor 410 may be a dedicated processor for performing in accordance with the present system or may be a general-purpose processor wherein only one of many functions operates for performing in accordance with the present system. The processor 410 may operate utilizing a program portion, multiple program segments, or may be a hardware device utilizing a dedicated or multi-purpose integrated circuit.

Embodiments of the present system may provide fast imaging methods to acquire and reconstruct images. Suitable applications may include imaging systems such as MRI and MRS systems and the like which require: a short acquisition time and high resolution while eliminating adverse effects such as due to chemical shift and main field inhomogeneity. Further variations of the present system would readily occur to a person of ordinary skill in the art and are encompassed by the following claims.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or an preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated; and i) the term "plurality of" an element includes two or more of the claimed element, and does not imply any particular range of number of elements; that is, a plurality of elements may be as few as two elements, and may include an immeasurable number of elements.

REFERENCES

References 1 through 4 listed below are incorporated herein by reference and are referred to herein using reference numerals R1 through R4, respectively, throughout the specification. For example, R1 may make reference to the first reference (e.g., by Pipe, J G).

1. Pipe J G. Motion correction with PROPELLER MRI: application to head motion and free-breathing cardiac imaging. Magn Reson Med 1999; 42:963-969.
2. Dixon WT. Simple proton spectroscopic imaging. Radiology 1984; 153:189-194.
3. Huo D, Li Z, Aboussouan E, Karis J P, Pipe J G. Turboprop IDEAL: a motion-resistant fat-water separation technique. Magn Reson Med 2009; 61:188-195.
4. Weng D, Pan Y, Zhong X, Zhuo Y. Water-fat separation with parallel imaging based on BLADE. Magn Reson Imaging 2013; 31:656-663.

The invention claimed is:

1. A magnetic resonance imaging system, the magnetic resonance imaging system comprising:

at least one controller configured to:

acquire magnetic resonance information on k-space lines for at least a first blade and separately for a second blade of a periodically rotated overlapping parallel lines with enhanced reconstruction (PROPELLER) imaging method for at least two of a plurality of slices;

generate, separately for each of the first and second blades, main magnetic field inhomogeneity information based only upon the acquired MR magnetic resonance information for the respective first and second blades, the main field inhomogeneity information indicating main magnetic field inhomogeneity within the main magnetic field for the respective first and second blades;

generate water and fat image information for each of the first blade and the second blade using only the MR information acquired for the respective blade and the generated main magnetic field inhomogeneity information for the corresponding blade of the first and second blades;

correct at least one of the generated water and fat image information for spatial distortions caused by the main magnetic field inhomogeneity; and save the at least one of the generated corrected water and fat image information in a memory.

2. The magnetic resonance imaging system of claim 1, wherein the at least one controller is further configured to reconstruct at least one image based upon the generated corrected water and fat image information for at least the first and second blades.

3. The magnetic resonance imaging system of claim 1, wherein the at least one controller is further configured to acquire the magnetic resonance information for at least the first and second blades within each echo train of at least two of a plurality of echo trains.

4. The magnetic resonance imaging system of claim 3, wherein the at least one controller is further configured to estimate and correct motion between at least the first and second blades based on at least one of the corrected water and fat image information so as to form separate or combined, motion-corrected water and fat information for at least the first and second blades, and save the motion-corrected water and fat image information in the memory.

5. The magnetic resonance imaging system of claim 3, wherein the at least one controller is further configured to perform a modified turbo-spin echo (TSE) sequence, in which the magnetic resonance information for at least the first and second blades is acquired for each echo shift of at least two of a plurality of echo shifts.

6. The magnetic resonance imaging system of claim 1, wherein the at least one controller is further configured to exchange, between at least the first and second blades, the generated main magnetic field inhomogeneity information for the generation of the water and fat image information.

7. A magnetic resonance imaging system, the magnetic resonance imaging system comprising:

at least one controller configured to:

acquire magnetic resonance information on k-space lines for at least a first blade and separately for a second blade of a periodically rotated overlapping parallel lines with enhanced reconstruction (PROPELLER) imaging method for at least two of a plurality of slices;

generate, main magnetic field inhomogeneity information separately for the first blade and the second blade based upon the acquired magnetic resonance information for the respective first and second blades, the main field inhomogeneity information indicating main field inhomogeneity within the main magnetic field for at least the first and second blades;

generate water and fat image information individually for at least the first blade and separately for the second blade based only upon the acquired MR magnetic resonance information acquired for the respective blades and the generated main magnetic field inhomogeneity information for the corresponding blade of the first and second blades;

correct at least one of the generated water and fat image information for spatial distortions caused by the generated main magnetic field inhomogeneity or a predetermined chemical shift difference between water and fat; and reconstruct at least one image based upon the generated corrected water and fat image information for at least the first and second blades.

8. A computer program stored on a computer readable non-transitory memory medium, the computer program configured to reconstruct images obtained from a magnetic resonance image system, the computer program comprising:

a program portion configured to:

acquire magnetic resonance information on k-space lines for at least a first blade and separately for the second blade of a periodically rotated overlapping parallel lines with enhanced reconstruction (PROPELLER) imaging method for at least two of a plurality of slices;

generate main magnetic field inhomogeneity information separately for the first blade and the second blade based upon the acquired magnetic resonance information, the main field inhomogeneity information indicating inhomogeneity within the main magnetic field for at least the first and second blades;

generate water and fat image information for at least the first blade and separately for the second blade based only upon the acquired magnetic resonance information for the respective blades and the generated main magnetic field inhomogeneity information for the corresponding blade of the first and second blades;

correct at least one of the generated water and fat image information for spatial distortions caused by the generated main magnetic field inhomogeneity or a predetermined chemical shift difference between water and fat; and save the at least one of the generated corrected water and fat image information in a memory.

9. The computer program of claim 8, wherein the program portion is further configured to reconstruct at least one image based upon the generated corrected water and fat image information for at least the first and second blades.

10. The computer program of claim 8, wherein the program portion is further configured to estimate and correct motion between at least the first and second blades based on at least one of the corrected water and fat image information so as to form separate, motion-corrected water and fat image information for at least the first and second blades, and save the motion-corrected water and fat image information in the memory.

11. The magnetic resonance imaging system of claim 7, wherein the at least one controller is further configured to:

reconstruct at least one image based upon the generated corrected water and fat image information for at least the first and second blades.

12. The magnetic resonance imaging system of claim 7, wherein the at least one controller is further configured to:

acquire the magnetic resonance information for at least the first and second blades within each echo train of at least two of a plurality of echo trains.

13. The magnetic resonance imaging system of claim 12, wherein the at least one controller is further configured to estimate and correct motion between at least the first and second blades based on at least one of the corrected water and fat image information so as to form separate or combined, motion-corrected water and fat information for at least the first and second blades, and save the motion-corrected water and fat image information in the memory.

14. The magnetic resonance imaging system of claim 12, wherein the at least one controller is further configured to perform a modified turbo-spin echo (TSE) sequence, in which the magnetic resonance information for at least the first and second blades is acquired for each echo shift of at least two of a plurality of echo shifts.

* * * * *